United States Patent
Kobayashi

(10) Patent No.: US 7,337,830 B2
(45) Date of Patent: Mar. 4, 2008

(54) COOLING DEVICE OF ELECTRONIC DEVICE

(75) Inventor: Shinichi Kobayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 457 days.

(21) Appl. No.: 11/041,268

(22) Filed: Jan. 25, 2005

(65) Prior Publication Data

US 2006/0102326 A1 May 18, 2006

(30) Foreign Application Priority Data

Nov. 17, 2004 (JP) .............................. 2004-333562

(51) Int. Cl.
*H05K 7/20* (2006.01)
(52) U.S. Cl. .............................. 165/104.33; 165/80.4; 361/699
(58) Field of Classification Search ............... 165/80.4, 165/104.33, 122; 361/697, 699
See application file for complete search history.

(56) References Cited

U.S. PATENT DOCUMENTS

| | | | | |
|---|---|---|---|---|
| 6,019,165 A | * | 2/2000 | Batchelder | 165/80.3 |
| 6,263,957 B1 | * | 7/2001 | Chen et al. | 165/80.4 |
| 6,408,937 B1 | * | 6/2002 | Roy | 165/104.33 |
| 6,668,911 B2 | * | 12/2003 | Bingler | 165/80.4 |
| 6,894,899 B2 | * | 5/2005 | Wu et al. | 361/699 |
| 7,100,677 B2 | * | 9/2006 | Lee et al. | 165/80.4 |
| 7,124,811 B2 | * | 10/2006 | Crocker et al. | 165/104.33 |
| 7,222,661 B2 | * | 5/2007 | Wei et al. | 165/80.4 |
| 2002/0162647 A1 | * | 11/2002 | Wagner | 165/121 |
| 2004/0052049 A1 | * | 3/2004 | Wu et al. | 361/699 |
| 2004/0240179 A1 | * | 12/2004 | Koga et al. | 361/699 |
| 2007/0089859 A1 | * | 4/2007 | Wei | 165/80.4 |

FOREIGN PATENT DOCUMENTS

JP          10-213370          8/1998

* cited by examiner

*Primary Examiner*—Allen J. Flanigan
(74) *Attorney, Agent, or Firm*—Kratz, Quintos & Hanson, LLP

(57) ABSTRACT

A disclosed cooling device of an electronic device includes a cooling section thermally connected to the heat-generating electronic device so as to cool the electronic device with cooling water forcibly supplied from a pump, and a heat exchanging section thermally connected to the cooling section to radiate heat transferred from the cooling section to the atmosphere through cooling air supplied from a fan. The cooling section and the heat exchanging section are directly thermally connected, and are arranged in the same housing.

7 Claims, 7 Drawing Sheets

COOLING DEVICE OF ELECTRONIC DEVICE

BACKGROUND OF THE INVENTION

1. Field of the Invention

The present invention generally relates to a cooling device of an electronic device, and particularly relates to a cooling device of an electronic device for cooling the electronic device with use of cooling water.

2. Description of the Related Art

In recent years, while electronic devices such as semiconductors have been developed to have higher density and higher speed, treatment of heat generated by the electronic devices is becoming a growing problem. When the heat generated by an electronic device increases to exceed the capacity of natural heat radiation with use of a radiation fin or the like, the device is forcibly cooled by a cooling device (as disclosed, for example, in Japanese Patent Laid-Open publication No. 10-213370).

FIG. 1 is an example of a related-art cooling device 1. As shown in the figure, the related-art cooing device 1 comprises a cooling section 2, a heat exchanging section 3, a tank 4, a pump 5 and pipes 8A through 8D. The tank 4 stores cooling water therein, and the pump 5 takes suction on the cooling water from the tank 4 through the pipe 8A to feed the water to the pipe 8B connected to the cooling section 2.

The cooling section 2 comprises a tabular cooling plate 2a having a cooling curved pipe 9 therein. The cooling section 2 is thermally connected to an electronic device 6 (installed on a substrate 7) as a heating element. The heat generated in the electronic device 6 is therefore transferred to the cooling water flowing in the cooling curved pipe 9 through the tabular cooling plate 2a. The electronic device 6 is thus cooled by the cooling section 2.

The cooling section 2 and the heat exchanging section 3 are connected by the pipe 8C. The cooling water heated by the cooling section 2 is sent to the heat exchanging section 3. The heat exchanging section 3 comprises a heat exchanging curved pipe 10 and a fan 11. The cooling air generated by the fan 11 is sent toward the heat exchanging curved pipe 10.

Accordingly, the heat of the cooling water is transferred so as to heat the cooling air, so that the temperature of the cooling water is lowered. The cooling water thus cooled passes through the pipe 8D and reaches the tank 4 again to be stored in the tank 4. The cooling water circulates in the cooling device 1 as described above while cooling the electronic device 6. The flowing direction of the cooling water is shown by the chain line arrows in FIG. 1.

In the related-art cooling device 1, however, the cooling section 2, the heat exchanging section 3, the tank 4 and the pump 5 are independent units arranged separately. Therefore, plural relatively long pipes 8A through 8D are required in order to connect devices 2 through 5 of the cooling device 1.

With such long pipes 8A thorough 8D, the heat absorption and heat radiation of the cooling water in the process of flowing in the pipes 8A to 8C heavily affect the cooling of the electronic device 6, resulting in worsening the heat transfer efficiency of the cooling device 1. Also, such long pipes 8A thorough 8D increase the pressure loss caused in the pipes 8A thorough 8D while the cooling water is passing thorough the devices 2 thorough 5, and therefore a pump 5 with a high capacity must be used. Accordingly, the size of the pump 5 is increased, so that the size of the cooling device is increased as well.

SUMMARY OF THE INVENTION

In view of the foregoing, it is a general object of the present invention to provide a cooling device of an electronic device to solve at lease one problem mentioned above. It is a more specific object of the present invention to provide a cooling device of an electronic device capable of achieving high cooling efficiency while reducing the size thereof.

Features and advantages of the present invention are set forth in the description that follows, and in part will become apparent from the description and the accompanying drawings, or may be learned by practice of the invention according to the teachings provided in the description. Objects as well as other features and advantages of the present invention will be realized and attained by a cooling device particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides as follows.

According to an aspect of the present invention, a cooling device of an electronic device is disclosed, which comprises a cooling water supplying section configured to supply cooling water, a cooling air supplying section configured to supply cooling air, a cooling section thermally connected to the electronic device to cool the electronic device with the cooling water supplied from the cooling water supplying section, and a heat exchanging section thermally connected to the electronic device to radiate heat transferred from the cooling section into the atmosphere through the cooling air supplied from the cooling air supplying section, wherein the cooling section and the heat exchanging section are directly thermally connected.

According to an embodiment of the present invention, since the cooling section and the heat exchanging section are directly thermally connected, the heat of the cooling section can be efficiently transferred to the heat exchanging section to be converted therein. Therefore, the electronic device can be efficiently cooled.

In the above-described cooling device of the electronic device, it is preferable that the cooling section and the heat exchanging section be provided integrally in a housing.

According to this configuration, since the cooling section and the heat exchanging section are provided integrally in the housing, space efficiency is improved, thereby downsizing the cooling device.

In the cooling device of the electronic device, it is preferable that the cooling water supplying section be provided integrally in the housing.

According to this configuration, since the cooling water supplying section is provided integrally in the housing, the cooling water supplying section and the cooling section are arranged in the same housing. Therefore, the flow path connecting the cooling water supplying section and the cooling section can be shortened, so that the pressure loss of the cooling water between the cooling water supplying section and the cooling section can be reduced. This allows the enhancement of the cooling efficiency and size reduction of the cooling device.

In the cooling device of the electronic device, it is preferable that the cooling air supplying section be provided integrally in the housing.

According to this configuration, since the cooling air supplying section is provided integrally in the housing, the cooling air supplying section and the heat exchanging section are arranged in the same housing. Therefore, the flow path connecting the cooling air supplying section and the heat exchanging section can be shortened, so that the pressure loss of the cooling air between the cooling air supplying section and the heat exchanging section can be reduced. This allows the enhancement of the cooling efficiency and size reduction of the cooling device.

It is preferable that the cooling device of the electronic device further comprises a tank configured to store the cooling water, wherein the tank is provided integrally in the housing, and the cooling water supplying section is arranged between the tank and the cooling section.

According to this configuration, since the tank is provided integrally in the housing, and since the cooling water supplying section is arranged between the tank and the cooling section, the loss of pressure for circulating the cooling water can be reduced. This allows size reduction of the cooling water supplying section, and consequently allows size reduction of the cooling device.

According to these aspects of the present invention, the heat of the cooling section can be efficiently transferred to the heat exchanging section to be converted therein. The output and size of the cooling water supplying section and the cooling air supplying section can be therefore reduced. This allows size reduction of the cooing device while maintaining high cooling efficiency.

DESCRIPTION OF THE PREFERRED EMBODIMENTS

In the following, an embodiment of the present invention is described with reference to the accompanying drawings.

Figure 1:
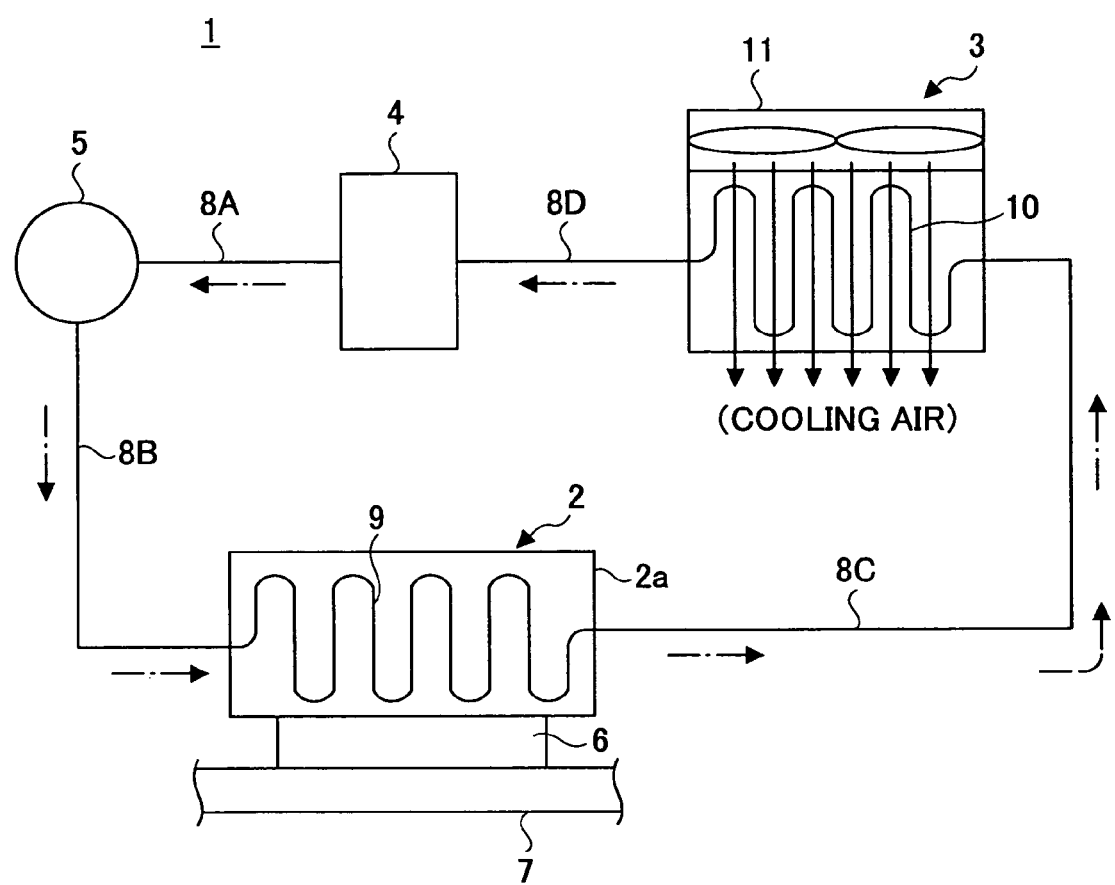
FIG. 1 is a block diagram of a related-art cooling device of an electronic device.
Figure 2:
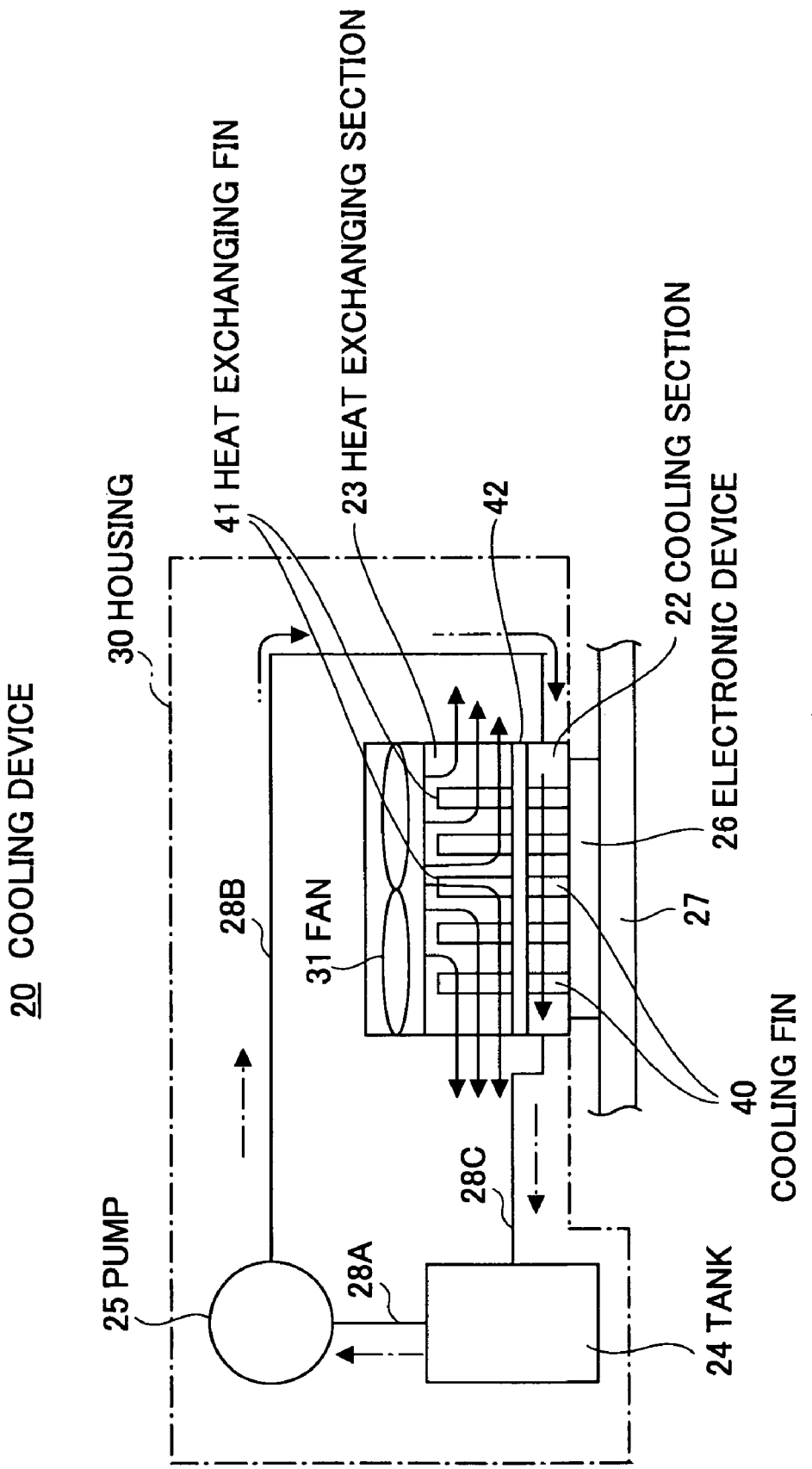
FIG. 2 is a block diagram of a cooling device of an electronic device according to an embodiment of the present invention.

FIGS. 2 through 7 are drawings illustrating a cooling device 20 of an electronic device according to one embodiment of the present invention. FIG. 2 is a block diagram of the cooling device 20, and FIGS. 3 through 7 are perspective views each showing the cooling device 20. First, the overall configuration of the cooling device 20 is described referring to FIG. 2.

The cooling device 20 generally comprises a cooling section 22, a heat exchanging section 23, a tank 24, a pump 25 (cooling water supplying section), a fan 31 (cooling air supplying section), and a housing, etc. The tank 24 stores cooling water 39 as refrigerating fluid (see FIG. 7). The pump 25 pumps the cooling water 39 from the tank 24 through a cooling channel 28A to feed the water to a cooling channel 28B connected to the cooling section 22.

The cooling section 22 has cooling fins 40 arranged therein, and the cooling water 39 flows in the cooling section 22 while being in contact with the cooling fins 40. The cooling section 22 is thermally connected to an electronic device 26 (installed on a substrate 27) as a heating element. The heat generated in the electronic device 26 is therefore transferred to the cooling water 39 flowing in the cooling section 22. The electronic device 26 is thus cooled by the cooling section 22.

The cooling section 22 is attached to the heat exchanging section 23, whose liquidtightness is defined by a divider plate 42. Heat exchanging fins 41 are provided inside the heat exchanging section 23.

The heat exchanging fins 41 and the above-described cooling fins 40 are thermally connected through the divider plate 42. In other words, the cooling section 22 and the heat exchanging section 23 are directly thermally connected. Therefore, the heat generated in the electronic device 26 and transferred to the cooling water 39 flowing in the cooling section 22 as descried above is transferred to the heat exchanging fins 41 through the cooling fins 40 and the divider plate 42.

The heat exchanging section 23 is connected to the fan 31, and the cooling air generated by the fan 31 is sent toward the heat exchanging fins 41. Accordingly, the heat of the electronic device 26 is transferred to the cooling water 39 in the cooling section 22, and then the heat of the cooling water 39 is transferred to the heat exchanging fins 41 through the cooling fins 40 and the divider plate 42 to be converted into heat of the cooling air supplied by the fan 31. With this configuration, even when the temperature of the electronic device 26 is raised by the heat generated by the electronic device 26, the cooling water 39 immediately goes through heat conversion due to heat exchanging section 23, thereby always maintaining a substantially constant temperature.

The cooling water 39 that has served to cool the electronic device 26 in the cooling section 22 passes through the cooling channel 28C to be stored in the tank 24 again. The flowing direction of the cooling water is shown by the chain line arrows in FIG. 2.

According to this embodiment, the cooling section 22 and the heat exchanging section 23 have a direct thermal connection. With this configuration, the heat of the cooling water 39 flowing in the cooling section 22 can be efficiently transferred to the heat exchanging section 23 to be converted therein, so that the electronic device 26 is efficiently cooled. Also, in this embodiment, the cooling section 22, the heat exchanging section 23, the tank 24, the pump 25 and the fan 31 are all arranged in the same housing 30. Such a configuration allows size reduction of the cooling device 20 and the enhancement of cooling efficiency. This point is discussed below in more detail.

Figure 3:
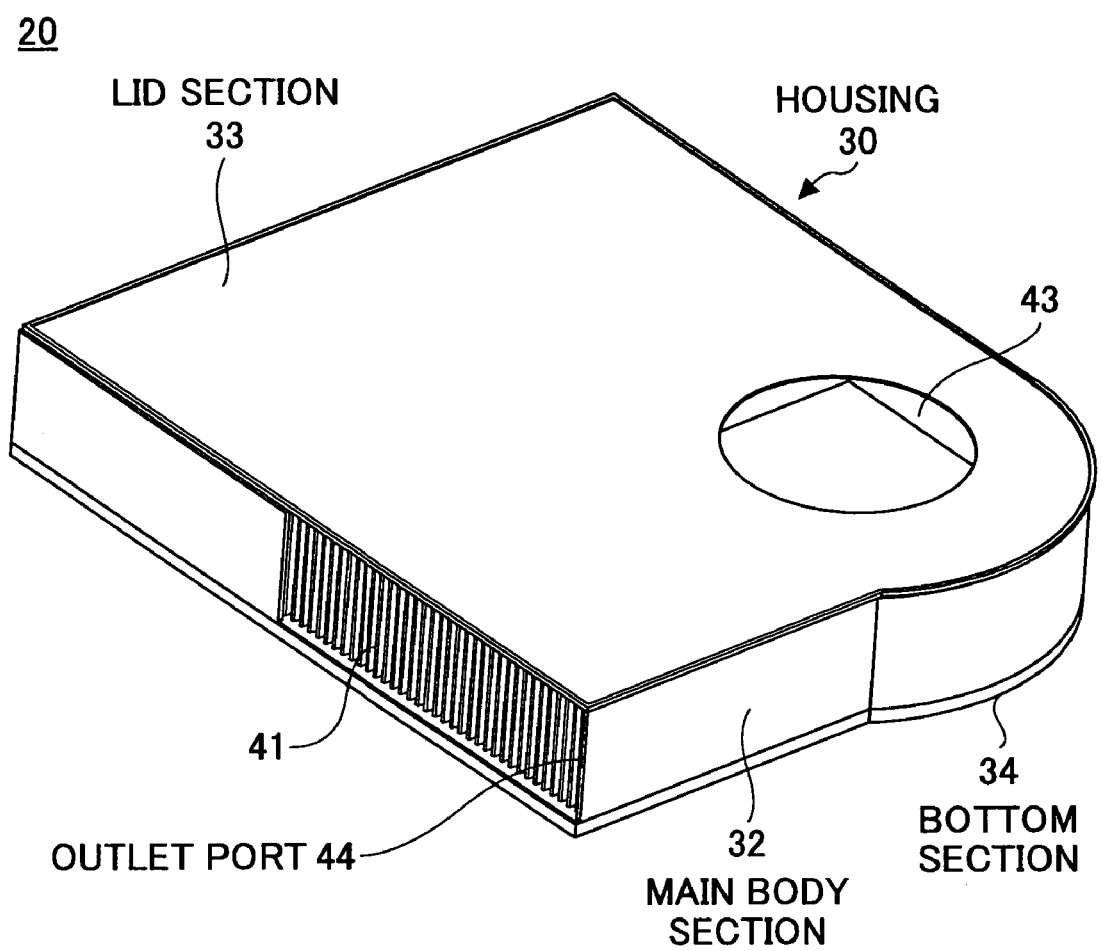
FIG. 3 is a perspective view showing the appearance of the cooling device of the electronic device according to the aforesaid embodiment of the present invention.
Figure 4:
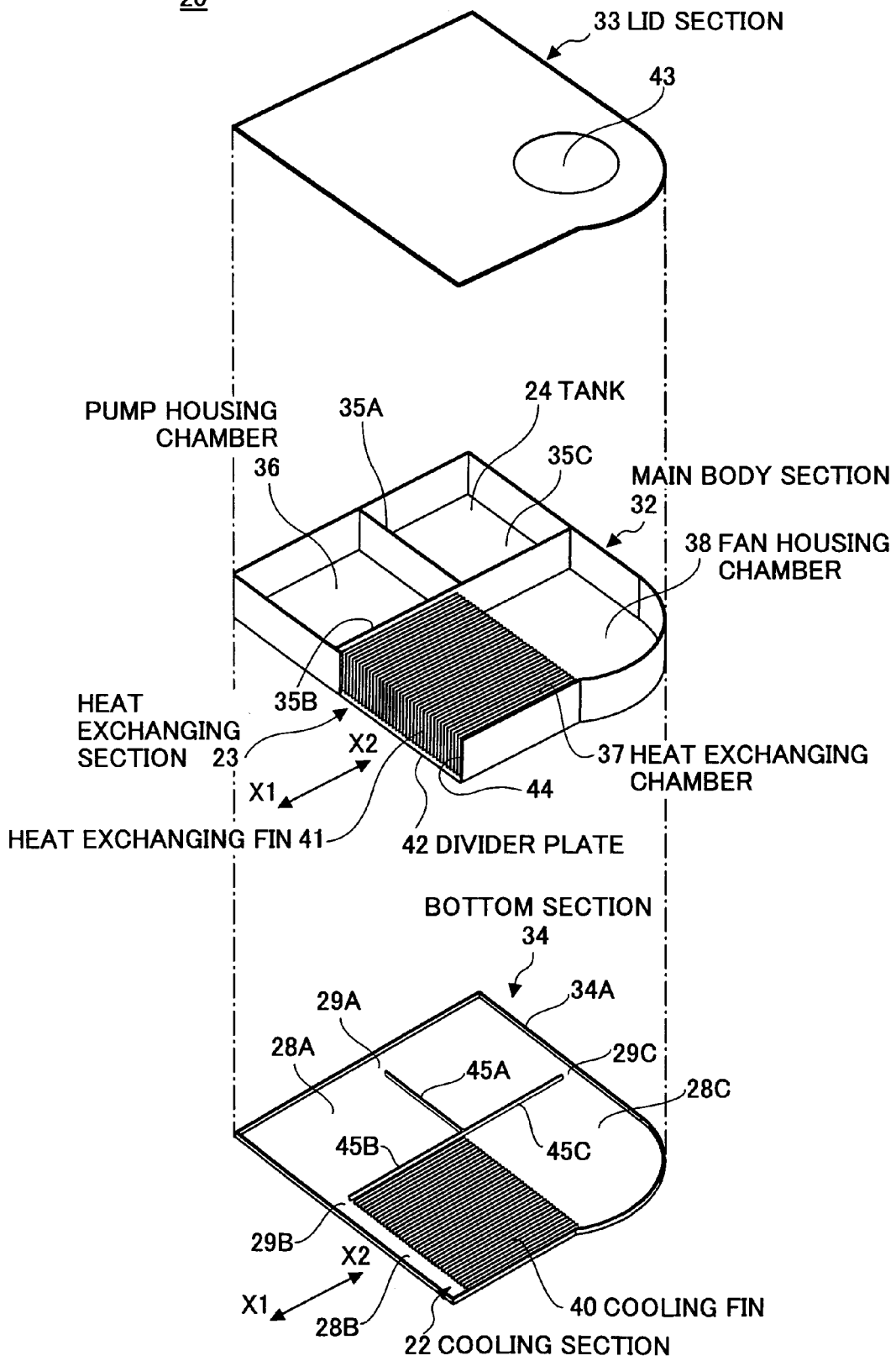
FIG. 4 is an exploded perspective view showing the cooling device of the electronic device according to the aforesaid embodiment of the present invention.
Figure 5:
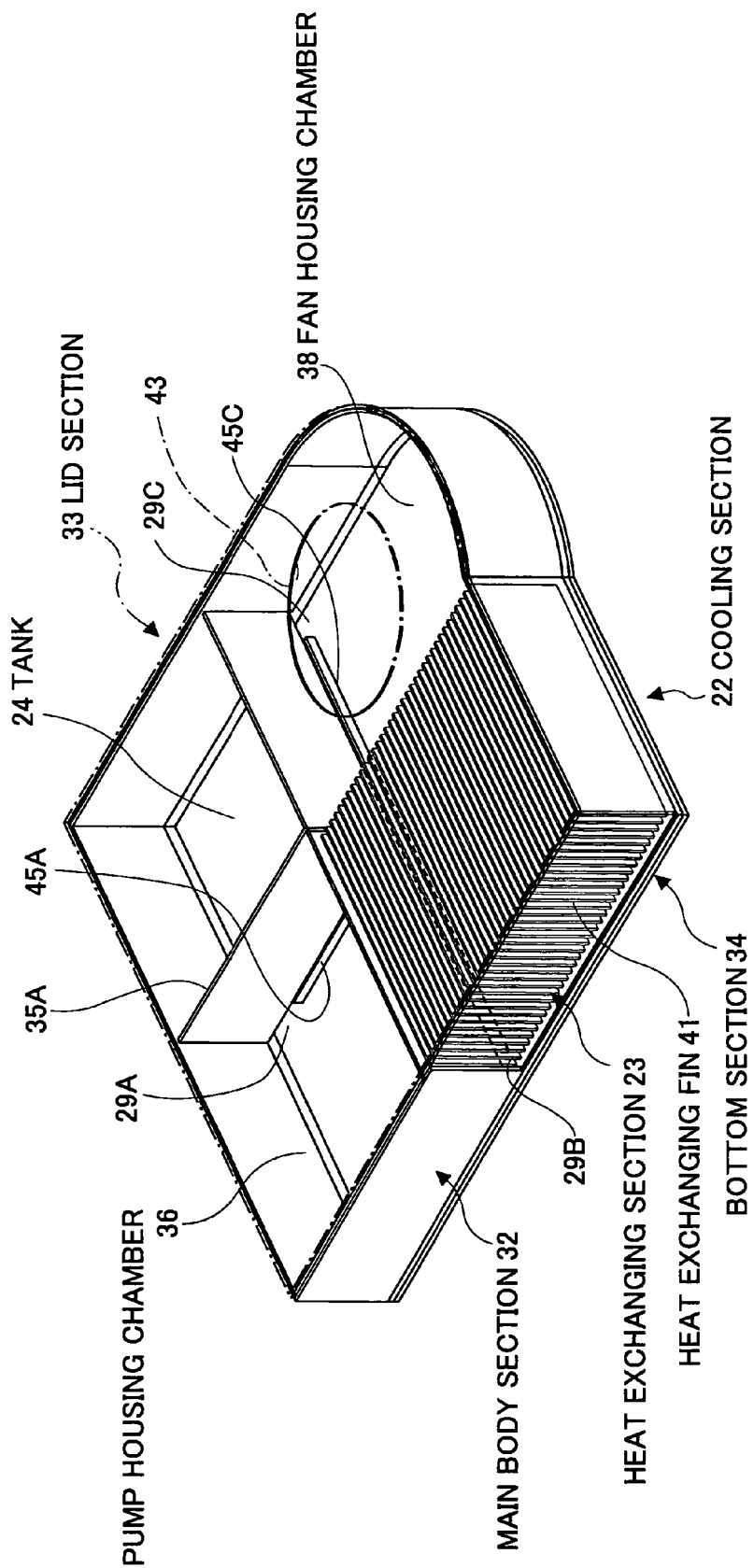
FIG. 5 is an illustration of a housing containing the cooling device of the electronic device with a lid section in perspective according to the aforesaid embodiment of the present invention.

Referring to FIGS. 3 and 4, the housing 30 generally comprises a main body section 32, a lid section 33 and a bottom section 34, etc. FIG. 3 is an illustration of the main body section 32, the lid section 33 and the bottom section 34 being in the assembled state, and FIG. 4 is an exploded view of the housing 30.

The main body section 32 is generally rectangular in shape (having a curved section on a fan housing chamber 38 in this embodiment), and partition walls 35A through 35C are provided therein. The lid section 33 is provided with an intake port 43 at a position opposing to the fan housing chamber 38 to be described below. The bottom section 34 is provided with a peripheral wall 34A, ribs 45A through 45C, and the cooling fins 40.

The housing 30 is formed by attaching the lid section 33 to an opening part (at the upper side in the drawing) of the main body section 32, and attaching the bottom section 34 to an opening part (at the lower side in the drawing) of the main body section 32. At the time of attaching the lid section 33 and the bottom section 34 to the main body section 32, the pump 25 and the fan 31 are also mounted therein.

Figure 7:
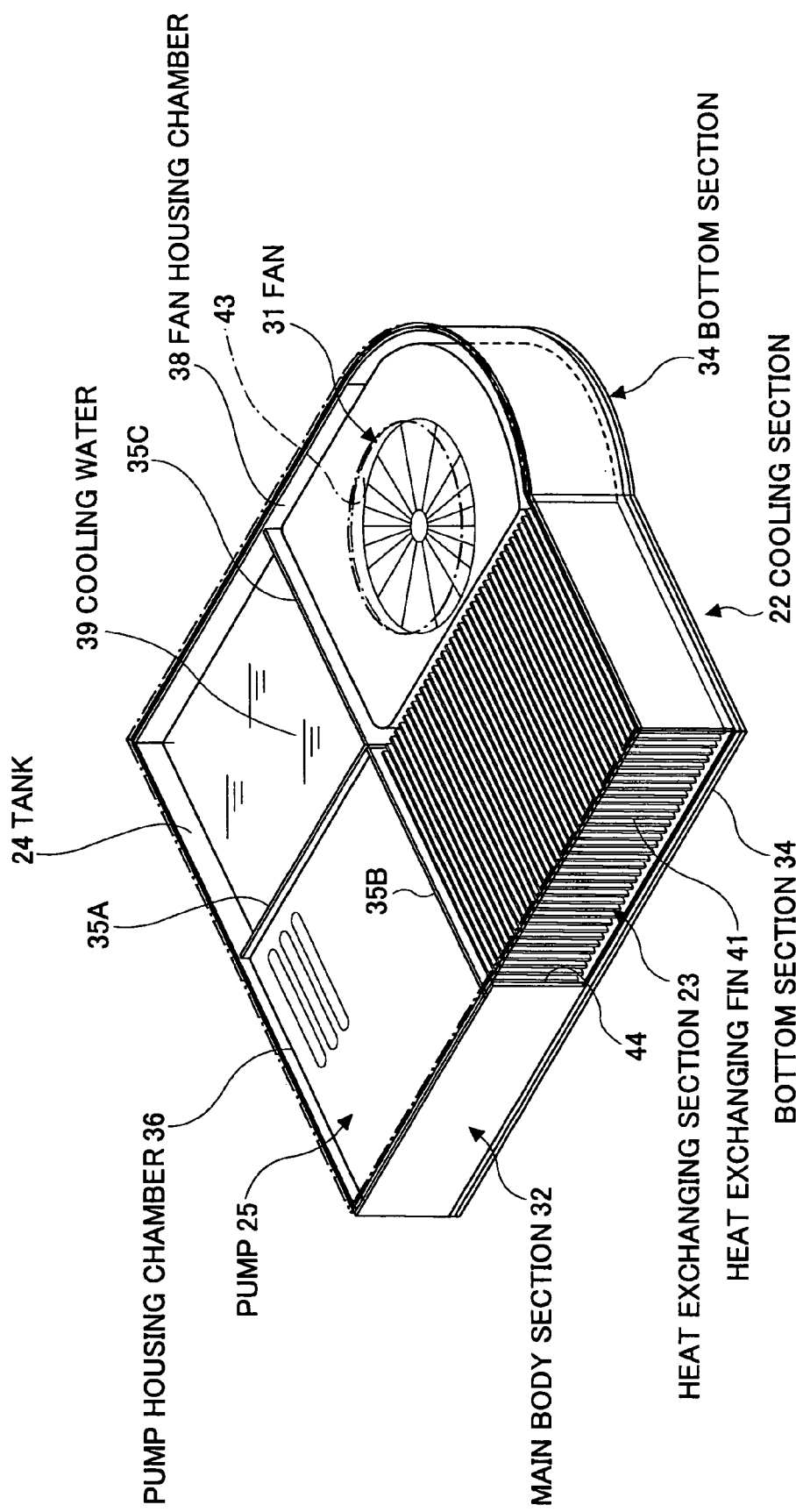
FIG. 7 is an illustration of the cooling device of the electronic device with the lid section in perspective according to the aforesaid embodiment of the present invention.

Specifically, since the main body section 32 is provided with the partition walls 35A through 35C as previously mentioned, the tank 24, a pump housing 36, a heat exchanging chamber 37 and the fan housing chamber 38 are formed inside the main body section 32 by attaching the lid section 33 and the bottom section 34. As shown in FIG. 7, the pump 25 is housed in the pump housing 36, and the fan 31 is housed in the fan housing chamber 38.

As shown in FIG. 4, the ribs 45A through 45C are formed on the bottom section 34, corresponding to the partition walls 35A through 35C. Therefore, when the bottom section 34 is attached to the main body section 32, the ribs 45A through 45C liquid-tightly abut on the partition walls 35A through 35C, respectively.

Meanwhile, as shown in FIG. 4, the ribs 45A through 45C formed on the bottom section 34 are not in contact with the peripheral wall 34A. Therefore, when the bottom section 34 is attached to the main body section 32, an opening 29A is formed between the rib 45A and the peripheral wall 34A. Likewise, an opening 29B is formed between the rib 45B and the peripheral wall 34A, and an opening 29C is formed between the rib 45C and the peripheral wall 34A. The openings 29A through 29C serve as passages through which the cooling water 39 passes.

The divider plate 42 is formed at the bottom of the heat exchanging chamber 37 of the main body section 32, and a number of heat exchanging fins 41 are integrally formed on the divider plate 42. The cooling fins 40 at the bottom section 34 are formed at positions corresponding to the heat exchanging fins 41. There is a clearance between the peripheral wall 34A on the outer circumference of the bottom section 34 and ends (in the direction of arrow X1) of the cooling fins 40 (see FIG. 4).

The heat exchanging fins 41 on the main body section 32 and the cooling fins 40 on the bottom section 34 are respectively formed to extend in the direction of arrows X1, X2 shown in FIG. 4, and are arranged to have a clearance between adjacent cooling fins 40 and between adjacent heat exchanging fins 41. The cooling air generated by the fan 31 flows through the heat exchanging fins 41 clearances in the direction of arrow X1, while transferring (or converting) the heat of the electronic device 26 transferring to the heat exchanging fins 41 from the cooling water 39 and the cooling fins 40 through the divider plate 42.

FIG. 7 shows the cooling device 20 with the lid section 33 in perspective. As shown in the drawing, the cooling water 39 is stored in the tank 24. Also, the pump 25 is housed in the pump housing chamber 36, and the fan 31 is housed in the fan housing chamber 38. The surface (at the lower side in the drawing) of the pump 25 is waterproof, and the surface (at the lower side of the drawing) of the fan 31 is also waterproof. Likewise, surfaces of the pump 25 and the fan 31 abutting the inner wall of the main body section 32 have waterproof coatings.

Therefore, the cooling channels 28A through 28C through which the cooling water 39 flows are formed at the space (hereinafter referred to as the cooling channel 28A) between the lower surface of the pump 25 and the bottom section 34, the space between the divider plate 42 and the bottom section 34, and the space (hereinafter referred to as the cooling channel 28C) between the lower surface of the fan 31 and the bottom section 34. In FIG. 4, the reference numerals 28A through 28C are shown at the positions corresponding to the above-described cooling channels of the bottom section 34 for convenience of explanation.

With such a configuration, the cooling water 39 in the tank 24 is pumped by the pump 25, and passes through the opening 29A to flow into the cooling channel 28A. After passing through the cooling channel 28A, the cooling water 39 passes through the opening 29B to flow into the cooling channel 28B. After flowing into the cooling channel 28B, the cooling water 39 flows through the clearances between the cooling fins 40 in the direction of arrow X2 shown in FIG. 4 to reach the cooling channel 28C. Then, the cooling water 39 passes through the opening 29C to flow back to the tank 24 again.

Figure 6:
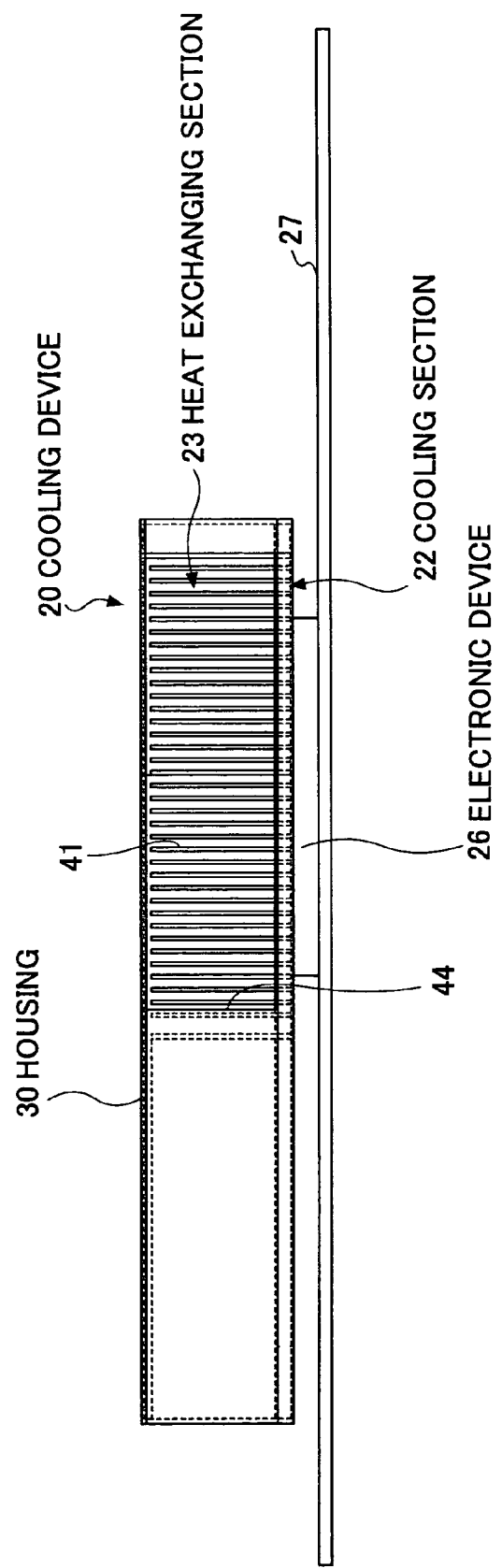
FIG. 6 is a side elevational view of the electronic device being cooled by the cooling device according to the aforesaid embodiment of the present invention.

As shown in FIG. 6, since the cooling section 22 is thermally connected to the electronic device 26, i.e., an object to be cooled, the heat of the electronic device 26 is transferred to the cooling fins 41 through the bottom section 34 and then transferred to the cooling water 39 passing between the cooling fins 40. Thus, the electronic device 26 is cooled. The heat of the cooling water 39 and the cooling fins 40 is transferred to the heat exchanging fins 41 through the divider plate 42, and cooled (or converted) by the cooling air supplied by the fan 31 as previously described.

In the cooling device 20 according to this embodiment, as described above, since the cooling section 22 and the heat exchanging section 23 are provided integrally in the housing 30, space efficiency is improved, thereby downsizing the cooling device 20. Also, since the pump 25 is provided integrally in the housing 30, the flow path connecting the pump 25 and the cooling section 22 can be shortened. Therefore, the pressure loss between the pump 25 and the cooling section 22 can be reduced. In this embodiment, since the pump 25 is arranged between the tank 24 and the cooling section 22, the loss of pressure for circulating the cooling water 39 is reduced. This configuration allows the use of a small pump 25, and hence the enhancement of cooling efficiency and size reduction of the cooling device 20 can be achieved.

The cooling water used in this embodiment is not limited to water, but refrigerating fluid made of other materials may be used. The cooling water used in this embodiment includes such materials.

Further, the present invention is not limited to the embodiment, but variations and modifications may be made without departing from the scope of the present invention.

The present application is based on Japanese Priority Application No. 2004-333562 filed on Nov. 17, 2004, with the Japanese Patent Office, the entire contents of which are hereby incorporated by reference.

What is claimed is:

1. A device for cooling an electronic device, comprising:
a tank configured to store cooling water;
a cooling water supplying section configured to supply cooling water;
a cooling air supplying section configured to supply cooling air;
a cooling section thermally connected to the electronic device to cool the electronic device with the cooling water forcibly supplied from the cooling water supplying section; and a heat exchanging section thermally connected to the electronic device to radiate heat transferred from the cooling section to the atmosphere through the cooling air forcibly supplied from the cooling air supplying section;

wherein the cooling section and the heat exchanging section are directly thermally connected, wherein the cooling water supplying section is arranged between the tank and the cooling section.

2. The device for cooling the electronic device as claimed in claim 1, wherein the cooling section and the heat exchanging section are provided integrally in a housing.

3. The device for cooling the electronic device as claimed in claim 2, wherein the cooling water supplying section is provided integrally in the housing.

4. The device for cooling the electronic device as claimed in claim 2, wherein the cooling air supplying section is provided integrally in the housing.

5. The device for cooling the electronic device as claimed in claim 3, wherein the tank is provided integrally in the housing.

6. The device for cooling the electronic device as claimed in claim 5, further comprising:

a communication passage connecting the cooling section and the tank;

wherein the communication passage is provided in a position where the cooling air supplying section in the housing is arranged.

7. The cooling device of the electronic device as claimed in claim 1, wherein a plurality of first fins extending toward the cooling section and a plurality of second fins extending toward the heat exchanging section are formed on one or more partition walls defining the cooling section and the heat exchanging section.

* * * * *